US005875138A

United States Patent [19]
Hoenigschmid

[11] Patent Number: 5,875,138
[45] Date of Patent: Feb. 23, 1999

[54] DYNAMIC ACCESS MEMORY EQUALIZER CIRCUITS AND METHODS THEREFOR

[75] Inventor: Heinz Hoenigschmid, Starnberg, Germany

[73] Assignee: Siemens Aktiengesellschaft, Munich, Germany

[21] Appl. No.: 884,855

[22] Filed: Jun. 30, 1997

[51] Int. Cl.$^6$ ..................................................... G11C 7/00
[52] U.S. Cl. ........................... 365/203; 365/63; 257/390; 257/401; 257/412
[58] Field of Search ..................................... 365/203, 205, 365/207, 63; 257/390, 401, 412

[56] References Cited

U.S. PATENT DOCUMENTS 5,506,805  4/1996  Hirose et al. ............................ 365/203
5,594,701  1/1997  Asaka et al. ............................ 365/203

Primary Examiner—Vu A. Le
Attorney, Agent, or Firm—Stanton C. Braden

[57] ABSTRACT

An equalizer circuit for precharging a pair of bit lines in a dynamic random access memory circuit. The equalizer circuit includes a substantially T-shaped polysilicon gate portion oriented at an angle relative to the pair of bit lines. The angle is an angle other than an integer multiple of 90°. The substantially T-shaped polysilicon gate portion includes first polysilicon area for implementing a gate of a first switch of the equalizer circuit. The first switch is coupled to a first bit line of the pair of bit lines and a second bit line of the pair of bit lines. The substantially T-shaped polysilicon gate portion also includes a second polysilicon area for implementing a gate of a second switch of the equalizer circuit. The second switch is coupled to the first bit line of the pair of bit lines and a precharge voltage source. The substantially T-shaped polysilicon gate portion further includes a third polysilicon area for implementing a gate of a third switch of the equalizer circuit. The third switch is coupled to the second bit line of the pair of bit lines and the precharge voltage source.

22 Claims, 5 Drawing Sheets

DYNAMIC ACCESS MEMORY EQUALIZER CIRCUITS AND METHODS THEREFOR

BACKGROUND OF THE INVENTION

The present invention relates to dynamic random access memory circuits and particularly to equalizing circuits in dynamic random access memory circuits.

Dynamic random access memory (DRAM) circuits are known. In a DRAM circuit, there may be millions, even billions, of memory cells. The memory cells are typically grouped in a plurality of memory arrays, each of which contains a subset of the total number of memory cells of the DRAM circuit. By way of example, a 256 Megabit DRAM cell may have up to 256 arrays, each of which may contain roughly 1-megabit of DRAM cells. The arrays may be arranged in rows and columns, e.g., 32×8 in one example.

The memory cells in each array are also arranged in rows and columns for ease of access. A plurality of bit lines and word lines are then employed to read from and/or write to each memory cell. For ease of discussion, the bit lines may be thought of as being in the vertical direction although bit lines may be either vertical or horizontal, with the word lines disposed orthogonal to the bit lines.

A column of memory cells is generally coupled to a pair of bit lines. During the active cycle of the DRAM, information may be written to or read from the cells through the bit lines. The bit lines are typically complementary, with one bit line low and the other bit line high during reading or writing. By way of example, if the DRAM operates on 3V, the voltages on the bit lines are typically 0V and 3V during a given active cycle.

During the inactive cycle, the bit lines are precharged in preparation for the next active cycle. Precharging equalizes the voltages on the pair of bit lines to a predetermined voltage level, which typically is about ½ of the "high" voltage level. Using the previous example, the voltages on the pair of bit lines may be precharged to, for example, 1.5 V in preparation for the next active cycle.

To facilitate discussion, FIG. I illustrates an exemplary prior art equalizer circuit 100 employed to precharge the bit lines. As shown, the circuit is coupled to bit lines 102a and 102b from array 104. Bit lines 102a and 102b, as mentioned before, are complementary of one another. During the inactive cycle, a signal EQ on conductor 106 turns on switch 108 (typically an n-FET device) to short bit lines 102a and 102b together to substantially equalize their voltages. The same signal EQ also turns on switch 110, which is typically an n-FET device that is coupled to bit line 102a, to supply a precharge potential level VBLEQ to bit line 102a. The same signal EQ also turns on switch 112, which is typically an n-FET device that is coupled to bit line 102b, to supply a precharge potential level VBLEQ to bit line 102b. By turning on all these three switches 108, 110, and 112 simultaneously, the voltages on bit lines 102a and 102b are equalized and precharged to the precharge potential level VBLEQ during the DRAM inactive cycle. Since all three switches 108, 110, and 112 participate in equalizing the bit lines, they are referred to herein as the set of three equalizing switches.

Precharge potential level VBLEQ is supplied to the aforementioned switches 110 and 112 through an optional current limiting switch 114. Switch 114 is typically an n-FET depletion device that has its gate and source coupled together. Accordingly, switch 114 is normally "on" and VBLEQ is always supplied to switches 110 and 112 (the bit lines themselves do not receive VBLEQ until switches 110 and 112 are turned on, as discussed earlier). If a column of cells is defective (e.g., either bit line 102a or 102b is shorted to ground), switch 114 prevents the defect from drawing down the voltage level of VBLEQ excessively and from rendering the entire DRAM unusable. The defective column of cells may then be replaced by a redundant column of cells using standard replacement techniques.

FIG. 2 is a layout view of equalizer circuit 100 of FIG. 1, including bit lines 102a and 102b. In FIG. 2, three layers are shown: a metal layer, a polysilicon layer, and an active layer. The metal layer is employed for implementing the bit lines and some interconnect. The metal layer overlies a polysilicon layer and is insulated therefrom by a layer of dielectric. The polysilicon layer is employed to implement gates of the switches and to provide conduction among some switches. The polysilicon layer overlaps an underlying active layer in some places to form n-FET switches. The functions of the devices of FIG. 2 are more fully discussed in the explanation that follows.

Signal EQ of FIG. 1 is provided on metal line 200. Through contact 202, signal EQ is also provided to polysilicon conductor 204. Polysilicon conductor 204 furnishes the gates for switches formed where polysilicon conductor 204 overlies an underlying active layer 206. As polysilicon conductor 204 overlies active layer 206 in multiple places, multiple switches are formed.

Switch 108 of FIG. 1 is formed where polysilicon area 204a overlaps active areas 206a and 206b. As can be seen in FIG. 2, polysilicon area 204a is disposed in the vertical portion of the T-shaped polysilicon gate portion 204TA. Switch 110 of FIG. 1 is formed where polysilicon area 204b overlaps active areas 206c and 206d. As can be seen in FIG. 2, polysilicon area 204b is disposed in the horizontal portion of the T-shaped polysilicon gate portion 204TA. Switch 112 of FIG. 1 is formed where polysilicon area 204c overlaps active areas 206e and 206f. As can be seen in FIG. 2, polysilicon area 204b is disposed in the other horizontal portion of the T-shaped polysilicon gate portion 204TA. Polysilicon areas 204a, 204b, and 204c of polysilicon conductor 204 make up the T-shaped polysilicon gate portion 204TA that forms switches 108, 110, and 112. For ease of reference, this polysilicon conductor is referred herein as T-shaped polysilicon gate portion 204TA (to distinguish it from the T-shaped polysilicon gate portion 204TB of the adjacent bit line pairs).

Active area 206a of switch 108 is coupled to bit line 102a through contact 220. Active area 206b of switch 108 is coupled to bit line 102b through contact 222. When the EQ signal is present on polysilicon conductor 204 (and therefore polysilicon area 204a), a conductive channel is created between active areas 206a and 206b of switch 108, thereby shorting together bit lines 102a and 102b in the manner discussed in connection with FIG. 1.

The presence of the EQ signal on polysilicon conductor 204 also causes this same signal to be present on polysilicon area 204b, thereby creating a conductive channel between active areas 206c and 206d, i.e., turning on switch 110. Likewise, the presence of the EQ signal on polysilicon conductor 204 also causes this same signal to be present on polysilicon area 204c, thereby creating a conductive channel between active areas 206e and 206f, i.e., turning on switch 112.

Active areas 206e and 206d, being in the same active area layer, are interconnected. This interconnection represents connector 120 of FIG. 1, i.e., the connector that couples switches 110 and 112 to VBLEQ (via switch 114). In FIG.

2, this interconnection is coupled to active area 206g of switch 114. A polysilicon gate area 230(a) of polysilicon line 230 serves as a gate for switch 114. This polysilicon layer 230 also couples through contact 234 with metal line 232, which is in turn coupled to the interconnection of active areas 206d/206e through contacts 236a and 236b. Metal line 232 therefore couples the gate of switch 114 to its source in the manner shown in FIG. 1. Normally, this source-to-gate connection permits switch 114 to remain on, i.e., to permit a conductive channel to exist between active areas 206g and 206h of switch 114.

Active area 206h is coupled in the active area layer to metal 240, which carries the VBLEQ signal. Thus the VBLEQ signal is supplied from metal 204 to switches 110 and 112 through switch 114. One skilled in the art would readily appreciate the correspondence between the elements of diagramatic FIG. 1 and of layout FIG. 2.

In FIG. 2, the area required to implement the equalizer circuit is bounded roughly within the area delineated by arrows X and Y. In a typical 256M-bit DRAM, for example, there may be up to 4000 bit line pairs in each array. To maximize the area available for implementing the equalizer circuits, designers have in the past interleaved the bit line pairs. By interleaving, the odd bit line pairs may be equalized with equalizer circuits provided at, for example, the upper edge of the array while the even bit line pairs may be equalized with equalizer circuits provided at, for example, the lower edge of the array.

FIG. 3 depicts a hypothetical array 300 to illustrate this interleaving concept. In array 300, odd bit line pairs 301 and 303 extend out from upper edge 320 to be equalized with equalizer circuits 322 and 324 provided within equalizer strip 326. Likewise, even bit line pairs 302 and 304 extend out from lower edge 350 to be equalized with equalizer circuits 352 and 354 provided within equalizer strip 356. By interleaving the bit line pairs, there is more area to implement the equalizer circuits within the equalizer strips, e.g., equalizer circuit 322, 324, 352, or 354, than if all the bit lines simple extended out of one of edges 320 and 350 of array 300.

Referring back to FIG. 2, it has been found that the X dimension of the equalizer circuit is typically predefined by the dimension of the design rules employed to fabricate the memory cells within the array. Accordingly, when the design rules for the array changes, the bit lines are spaced closer, which reduces the area available for implementing the equalizer circuit. By way of example, when the design rules within the array change from 0.25 micron to 0.175 micron, e.g., in the case of 1-Gigabit DRAM circuits, the X dimension available for implementing each equalizer circuit may be reduced to only, for example, 0.5 micron.

Although the design rules within the array may shrink, it has also been found that photolithography and design constraints prevent the designer from using correspondingly aggressive, i.e., small design rules, in the implementation of the equalizer circuits. This is due, in part, to the fact that the memory cells within the array are highly regular and repeatable and are therefore more suitable for the smaller design rules than those outside of the array.

As can be expected, the differential between the design rules employed inside the array and those employed outside the array gives rise to design difficulties. Consider the situation wherein the design rules inside the array is shrunk so that they are substantially smaller than those employed outside the array. Since the distance between adjacent bit line pairs shrink, e.g., between bit line pairs 301 and 303 of FIG. 3, less area is available for implementing the equalizer circuits outside of the array (as the term is used herein, "adjacent bit line pairs" refer to bit line pairs that are adjacent to one another on one side of the array). Unless an improved equalizer circuit design is found, it may no longer be possible to, for example, place the T-shaped polysilicon gate portions of adjacent equalizer circuits (e.g., T-shaped polysilicon gate portion 204TA and T-shaped polysilicon gate portion 204TB of FIG. 2) adjacent to one another along a row in the equalizer strip since the spacings between adjacent bit line pairs may be too small for such placement.

In view of the foregoing, there are desired improved equalizer circuit designs and methods therefor that advantageously reduce the area required for implementing the equalizer circuit.

SUMMARY OF THE INVENTION

The invention relates, in one embodiment, to an equalizer circuit for precharging a pair of bit lines in a dynamic random access memory circuit. The equalizer circuit includes a substantially T-shaped polysilicon gate portion oriented at an angle relative to the pair of bit lines. The angle is an angle other than an integer multiple of 90°. The substantially T-shaped polysilicon gate portion includes first polysilicon area for implementing a gate of a first switch of the equalizer circuit. The first switch is coupled to a first bit line of the pair of bit lines and a second bit line of the pair of bit lines.

The substantially T-shaped polysilicon gate portion also includes a second polysilicon area for implementing a gate of a second switch of the equalizer circuit. The second switch is coupled to the first bit line of the pair of bit lines and a precharge voltage source. The substantially T-shaped polysilicon gate portion further includes a third polysilicon area for implementing a gate of a third switch of the equalizer circuit. The third switch is coupled to the second bit line of the pair of bit lines and the precharge voltage source.

In another embodiment, the invention relates to a dynamic random access memory circuit, which includes an array of memory cells. The memory cells in the array are arranged in rows and columns. The array has a first equalizer area adjacent to a first edge of the array. The dynamic random access memory circuit includes a first pair of bit lines coupled to a first column of the memory cells. The first pair of bit lines extends into the first equalizer area.

The dynamic random access memory circuit also includes a first equalizer circuit disposed in the first equalizer area for precharging the first pair of bit lines to about a predefined precharge potential level. The first equalizer circuit includes a substantially T-shaped first polysilicon gate portion having a first polysilicon area, a second polysilicon area, and a third polysilicon area. The T-shaped first polysilicon gate portion is oriented at a first angle relative to the first pair of bit lines. The first angle is an angle other than an integer multiple of 90°.

The first equalizer circuit also includes a first switch coupled to a first bit line and a second bit line of the first pair of bit lines. The first polysilicon area represents a gate of the first switch which, when activated by a first signal supplied to the first polysilicon area, substantially equalizes potential levels on the first pair of bit lines. The first equalizer circuit also includes a second switch coupled to the first bit line of the first pair of bit lines and a precharge voltage supply source. The precharge voltage supply source supplies the predefined precharge potential level. The second polysilicon area represents a gate of the second switch which, when activated by the first signal supplied to the second polysilicon area, precharges the first bit line to about the predefined precharge potential level.

The first equalizer circuit further includes a third switch coupled to the second bit line of the first pair of bit lines and the precharge supply source. The third polysilicon area represents a gate of the third switch. The third switch, when activated by the first signal supplied to the third polysilicon area, precharges the second bit line to about the predefined precharge potential level.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

For comparison and contrast.

DETAILED DESCRIPTION OF THE INVENTION

The present invention will now be described in detail with reference to a few illustrative embodiments thereof as provided in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, there is provided an improved equalizer circuit design which advantageously reduces the area required for its implementation. The equalizer circuit is used in integrated circuits (ICs) such as, for example, memory ICs including DRAMs and synchronous DRAMs (SDRAMs). In accordance with this design, the T-shaped polysilicon gate portions of adjacent equalizer circuits of adjacent bit line pairs are rotated at angles other than an integer multiple of 90° relative to the bit line pairs and joined together to form a single polysilicon gate conductor for the two adjacent equalizer circuits. By simultaneously rotating two adjacent T-shaped polysilicon gate portions and joining them together to form a single polysilicon gate conductor, it becomes possible to provide equalizer circuits for the two adjacent bit line pairs although the area available for their implementation has shrunk.

In one embodiment, adjacent T-shaped polysilicon gate portions are rotated such that the left T-shaped polysilicon gate portion is rotated about 45° clockwise relative to the bit line pairs while the right T-shaped polysilicon gate portion is rotated about 45° counterclockwise relative to the bit line pairs. In this manner, an M-shaped polysilicon gate portion is formed, which consists roughly of two rotated T-shaped polysilicon gate portions joining together to provide the gates for the two set of equalizer switches (of which there are three main switches and one optional current limiting switch per set) of the two adjacent bit line pairs.

Alternatively, at least one of the adjacent T-shaped polysilicon gate portion is rotated at an angle other than an integer multiple of 90°. In one embodiment, the angle is about 45°. For example, either the left T-shaped polysilicon gate portion is rotated about 45° clockwise relative to the bit line pairs or the right T-shaped polysilicon gate portion is rotated about 45° counterclockwise relative to the bit line pairs.

Figure 4:
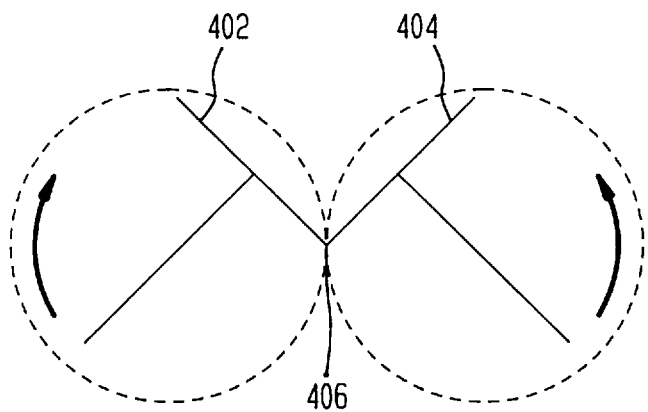
FIG. 4 illustrates, in accordance with one embodiment of the invention, the M-shaped polysilicon gate portion for implementing gates for two adjacent equalizer circuits.

FIG. 4 illustrates this embodiment wherein left T-shaped polysilicon gate portion 402 is rotated about 45° clockwise from vertical while the right T-shaped polysilicon gate portion 404 is rotated about 45° counterclockwise from vertical. Note that these two adjacent T-shaped polysilicon gate portions (associated with two adjacent bit line pairs) are allowed to remain connected (at point 406 as shown) to form an M-shaped polysilicon gate portion. From this M-shaped polysilicon gate portion, the gates for two sets of equalizing switches of two adjacent equalizer circuits are formed.

Figure 2:
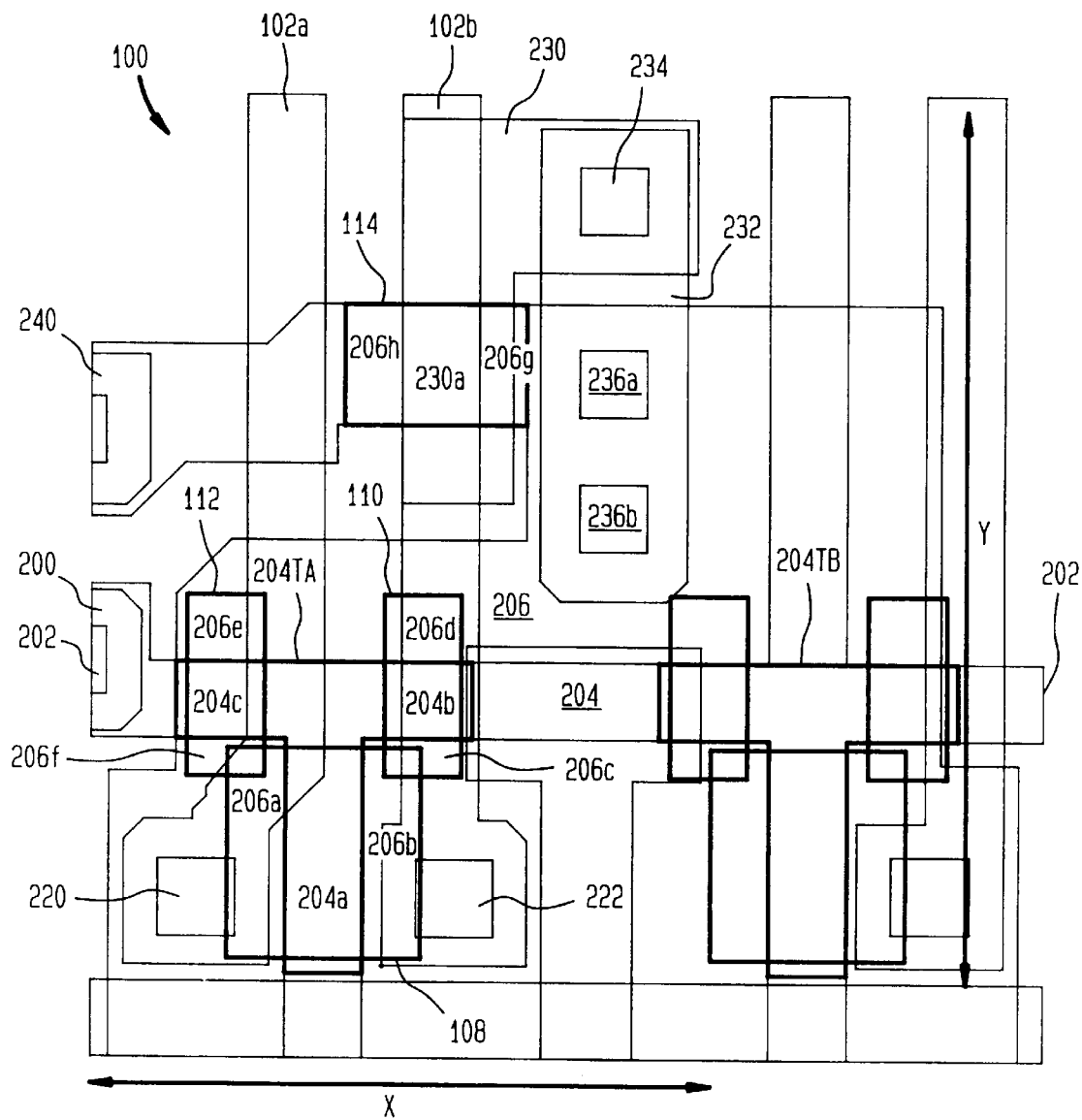
FIG. 2 is a layout view of the equalizer circuit of FIG. 1.
Figure 3:
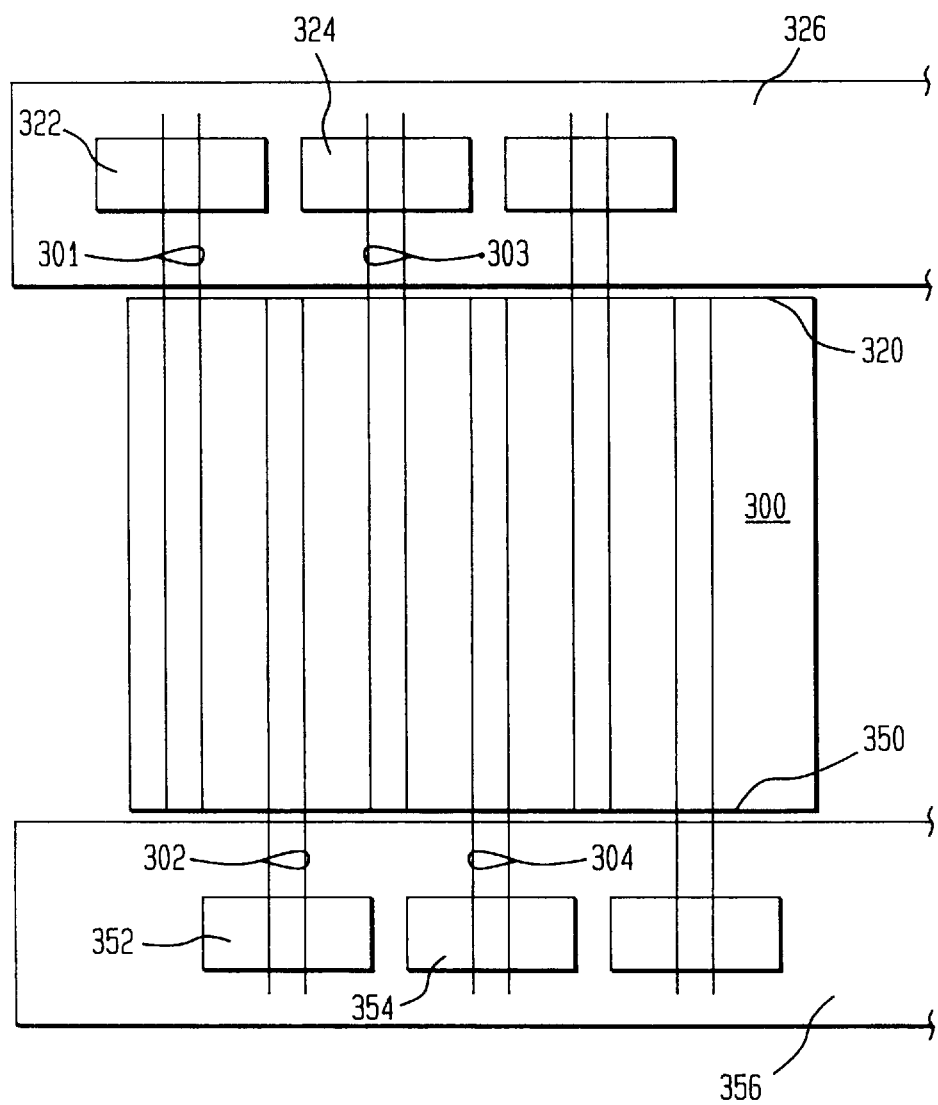
FIG. 3 depicts a hypothetical memory array to illustrate the interleaving concept.
Figure 5:
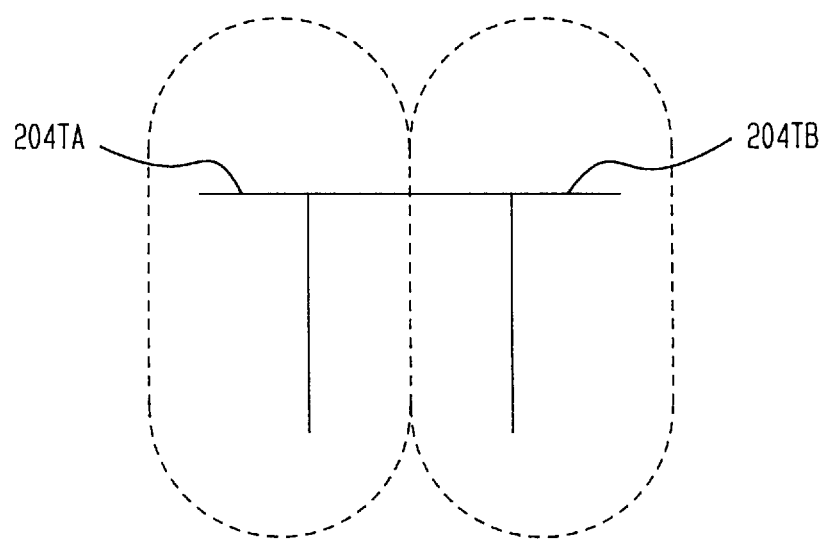
FIG. 5 illustrates the adjacent T-shaped polysilicon gate portions of the prior art equalizer circuits of FIG. 2.

For comparison and contrast, FIG. 5 illustrates the adjacent T-shaped polysilicon gate portions 204TA and 204TB of prior art FIG. 2 wherein the adjacent T-shaped polysilicon gate portions are laid out next to one another vertical to the bit lines. Note that for ease of reference, a convention is adopted herein whereby the T-shaped polysilicon gate portion is considered to be oriented by its vertical bar instead of its horizontal bar. Accordingly, a right-side up T-shaped polysilicon gate portion is considered to be oriented vertically. Using this convention, the prior art T-shaped polysilicon gate portion is considered to be oriented parallel to the bit lines.

Figure 1:
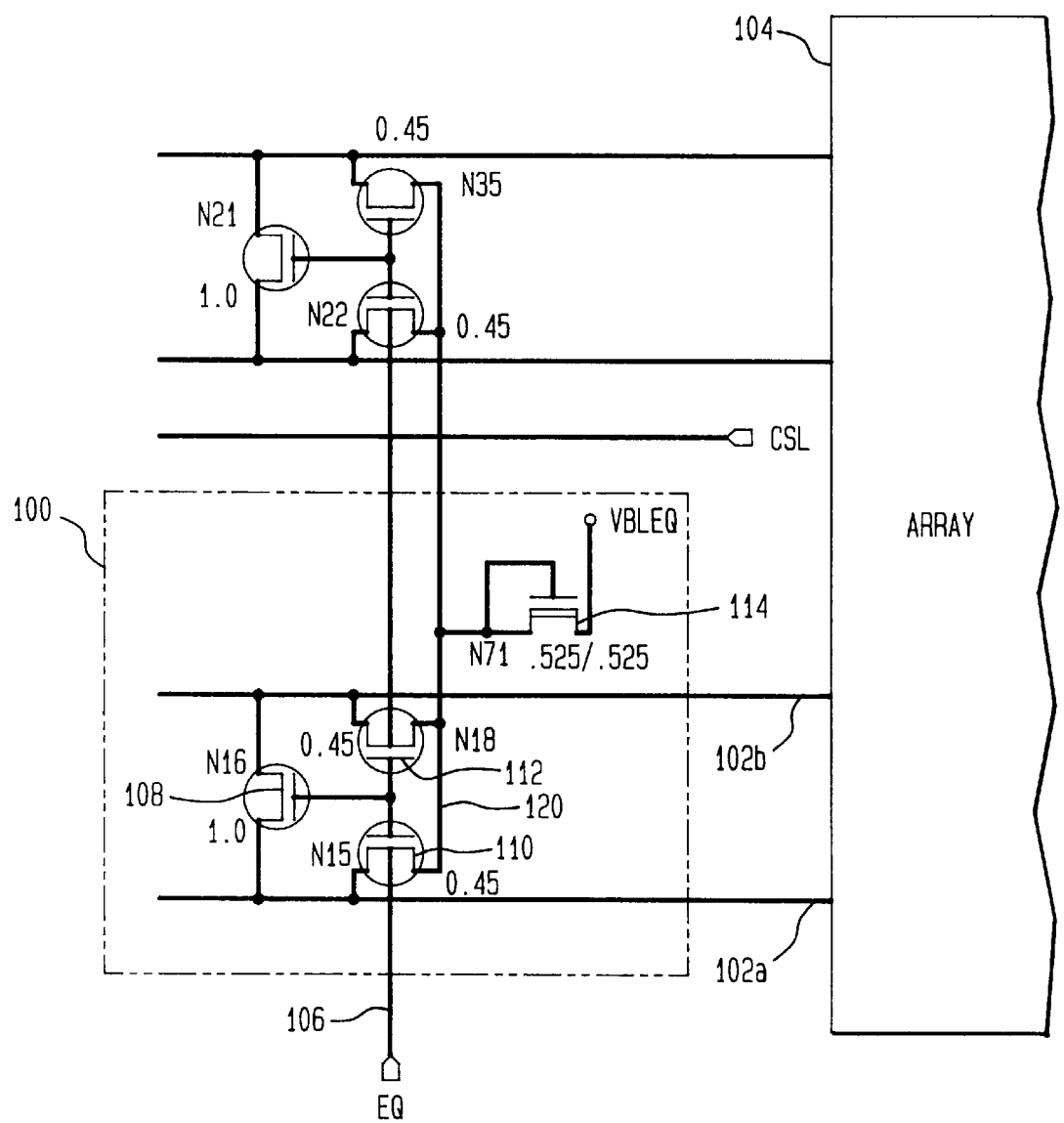
FIG. 1 illustrates an exemplary prior art equalizer circuit.
Figure 6:
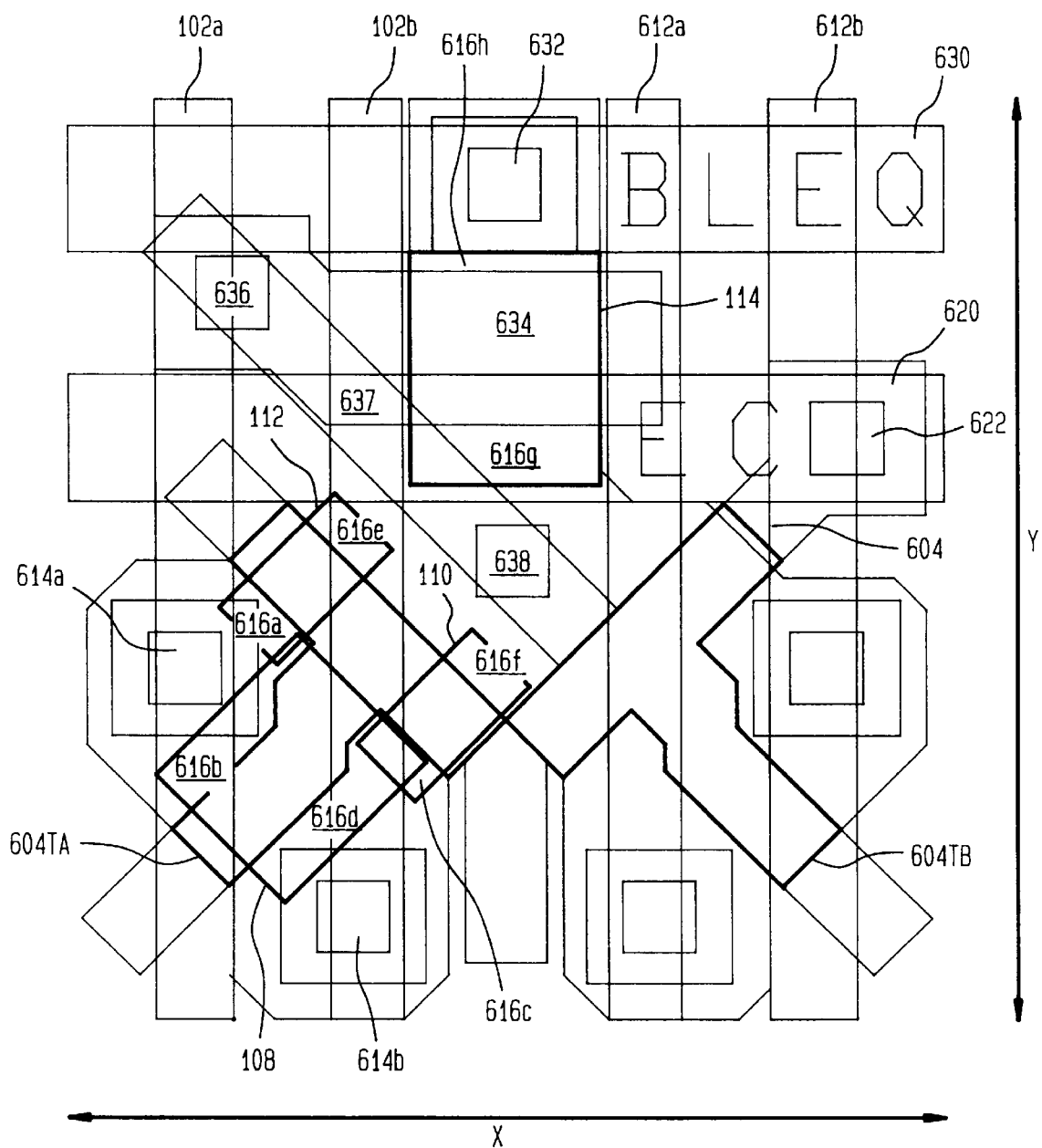
FIG. 6 illustrates, in accordance with one embodiment of the invention, a layout view of an inventive equalizer circuit employing the M-shaped polysilicon gate portion for implementing its switches.

The features and advantages of the present invention may be more fully understood with reference to FIG. 6 herein. In FIG. 6, the layout of the equalizer circuit of FIG. 1 is depicted, albeit implemented in accordance with the inventive equalizer circuit design proposed herein. In FIG. 6, polysilicon line 604 is shaped to form the aforementioned M-shaped polysilicon gate portion, of which a left T-shaped polysilicon gate portion 604TA and a right T-shaped polysilicon gate portion 604TB are shown.

Metal conductors 102a and 102b implement the bit lines of one bit line pair while metal conductors 612a and 612b implement the bit lines of the adjacent bit line pair. Through bit line contact 614a, bit line 102a makes contact with underlying active area 616a of switch 112 and underlying active area 616b of switch 108 (active area 616 being a continuous sheet). Through bit line contact 614b, bit line 102b makes contact with underlying active area 616c of switch 110 and underlying active area 616d of switch 108.

An active area 616e acts cooperatively with active area 616a and the polysilicon material of T-shaped polysilicon gate portion 604TA that is disposed in between active areas 616e and 616a to form the complete switch 112. Likewise, an active area 616f acts cooperatively with active area 616c and the polysilicon material of T-shaped polysilicon gate portion 604TA that is disposed in between active areas 616f and 616c to form the complete switch 110. Active area 616b acts cooperatively with active area 616d and the polysilicon material of T-shaped polysilicon gate portion 604TA that is disposed in between active areas 616b and 616d to form the complete switch 108.

Active area 616e of switch 112 is coupled with active area 616f of switch 110 through the continuous active area layer. Furthermore, these active areas 616e and 616f are coupled to active area 616g of switch 114 through the continuous active area layer. VBLEQ signal is provided on metal line 630, which is coupled to active area 616h of switch 114 through contact 632. A polysilicon gate 634 disposed above and in between active areas 616g and 616h completes switch 114. To couple the gate of switch 114 to its source in the manner shown in FIG. 1, polysilicon gate 634 is coupled to a contact 636, which is in turn coupled to a metal line 637. Metal line 637 couples polysilicon gate 634 to underlying active area 616g of switch 114 through a contact 638, thereby completing the gate-to-source connection for switch 114. It should be appreciated that this switch 114 is also shared by the equalizer circuit that is provided for adjacent bit line pairs 612a and 612b (the details of this adjacent equalizer circuit, which is analogous to the described equalizer circuit, is not repeated here for brevity sake).

When a signal EQ is provided on metal 620, polysilicon line 604 also receives this EQ signal through contact 622. The presence of the EQ signal on T-shaped polysilicon gate portion 602TA turns on switch 108, thereby connecting bit lines 102a and 102b. This equalizes bit lines 102a and 102b in the manner discussed earlier in connection with FIG. 1. Signal EQ also turns on switches 110 and 112 to couple bit lines 102a and 102b to VBLEQ (through optional current limiting switch 114). Accordingly, the precharge voltage level VBLEQ is provided to the bit lines in the manner discussed in connection with FIG. 1. The operation of the equalizer circuit associated with adjacent bit lines 612a and 612b of the adjacent bit line pair is analogous and will not be discussed here for brevity sake.

The rotation of the T-shaped polysilicon gate portions to form an M-shaped polysilicon gate portion for implementing gates of equalizing switches for adjacent bit line pairs provides many advantages. For example, the rotation of the T-shaped polysilicon gate portions permits the pair of equalizer circuits for the two adjacent bit line pairs (e.g., bit line pairs 102a/102b and 612a/612b of FIG. 6) to be implemented in the reduced X-dimension of the available equalizer circuit implementation area. The X-dimension of the available equalizer circuit implementation area is reduced because, as mentioned earlier, the distance between bit lines shrink when the design rules employed for implementing the cells and bit lines within the array shrink. When this happens, there may be insufficient space in the X-direction to, for example, lay out the two bit line contacts and the main equalizing switch of each equalizer circuit side-by-side. With reference to FIG. 2, these bit line contacts are shown as bit line contacts 220 and 222, and the main equalizing switch is shown as equalizing switch 108.

Offsetting the adjacent equalizer circuits of adjacent bit line pairs in the Y-direction may yield slightly more space to implement each equalizer circuit. However, this technique also has many problems, e.g., increasing the Y-dimension of the equalizer strip. Offsetting in the Y-direction the adjacent equalizer circuits of adjacent bit line pairs also presents bit line pairs of unequal length, capacitance, and resistance to the sensing amplifiers, which makes it difficult to implement the sensing amplifiers optimally.

More significantly, the use of the M-shaped polysilicon gate portion also permits the Y-dimension of the equalizer circuits to be reduced. This is surprising since one would expect rotated T-shaped polysilicon gate portions to require greater height to implement. However, the rotation of adjacent T-shaped polysilicon gate portions allows other devices of the equalizer circuits (e.g., switch 114, the various contacts and connectors, and the like) to be more efficiently implemented, which contributes to the surprising reduction in the Y-dimension of the equalizer circuit. By way of example, it has been found in one example that the invention reduces the Y-dimension to about 2.8 microns (versus about 4 microns for prior art FIG. 2). As a DRAM is made up of multiple arrays arranged in rows and columns, the ability to reduce the Y-dimension of the equalizer circuit is highly advantageous since it facilitates reduction in the area required to implement the equalizer strips at the top and bottom edges of the array. As can be appreciated by those skilled in the art, this reduction translates into smaller DRAM chip sizes, which increases design flexibility and reduces costs.

In contrast to the aforementioned offset approach (i.e., the alternative approach to gain more space to implement the equalizer circuits), the two rotated T-shaped polysilicon gate portions (e.g., T-shaped polysilicon gate portions 604TA and 604TB of FIG. 6) facilitate the implementation of equalizer switches that are substantially identical among adjacent bit line pairs. When the individual switches of the equalizer circuits are substantially identical across adjacent bit line pairs, their resistances and capacitances are substantially identical, which render the design of the sense amplifiers efficient.

As a further advantage, the length (and thus the capacitance and resistance) of adjacent bit line pairs are also substantially identical since no offsetting is involved. Since the adjacent bit line pairs as well as individual switches of the equalizer circuits are substantially identical across adjacent bit line pairs, it is possible to design a single optimal sense amplifier and to rely on that sense amplifier design for implementing an optimal sensing strategy for every bit line pair. This ability is critical in view of the fact that the memory cells in modern DRAMs store quite a small charge (e.g., as low as $32 \times 10^{-5}$ Farrad) and the sense amplifier must accurately sense a very small change in bit line potential (e.g., as low as about 0.10 V).

While this invention has been described in terms of several illustrative embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. An equalizer circuit for precharging a pair of bit lines in a dynamic random access memory circuit, comprising:

a substantially T-shaped polysilicon gate portion oriented at an angle relative to said pair of bit lines, said angle being an angle other than an integer multiple of 90°, said substantially T-shaped polysilicon gate portion including, a first polysilicon area for implementing a gate of a first switch of said equalizer circuit, said first switch being coupled to a first bit line of said pair of bit lines and a second bit line of said pair of bit lines;

a second polysilicon area for implementing a gate of a second switch of said equalizer circuit, said second switch being coupled to said first bit line of said pair of bit lines and a precharge voltage source; and a third polysilicon area for implementing a gate of a third switch of said equalizer circuit, said third switch being coupled to said second bit line of said pair of bit lines and said precharge voltage source.

2. The equalizer circuit of claim 1 wherein said first polysilicon area is disposed in a vertical portion of said substantially T-shaped polysilicon gate portion.

3. The equalizer circuit of claim 2 wherein said second polysilicon area is disposed in a horizontal portion of said substantially T-shaped polysilicon gate portion.

4. The equalizer circuit of claim 3 wherein said third polysilicon area is disposed in another horizontal portion of said substantially T-shaped polysilicon gate portion.

5. The equalizer circuit of claim 2 further comprising a first bit line contact disposed on a first side of said first polysilicon area, said first bit line contact coupling a first active area of said first switch to said first bit line of said pair of bit lines.

6. The equalizer circuit of claim 5 further comprising a second bit line contact disposed on a second side of said first polysilicon area opposite said first side, said second bit line contact coupling a second active area of said first switch to said second bit line of said pair of bit lines.

7. The equalizer circuit of claim 2 wherein said second switch and said third switch are coupled to said precharge voltage source through a fourth switch.

8. The equalizer circuit of claim 7 wherein said fourth switch is a gate-to-source connected depletion n-FET device.

9. The equalizer circuit of claim 1 wherein said angle is about 45°.

10. The equalizer circuit of claim 9 wherein said equalizer circuit is implemented using a first set of design rules, said pair of bit lines extending from an array of memory cells implemented using a second set of design rules, said second set of design rules being smaller than said first set of design rules.

11. A dynamic random access memory circuit, comprising:
    an array of memory cells, said memory cells in said array being arranged in rows and columns, said array having a first equalizer area adjacent to a first edge of said array,
    a first pair of bit lines coupled to a first column of said memory cells, said first pair of bit lines extending into said first equalizer area; and
    a first equalizer circuit disposed in said first equalizer area for precharging said first pair of bit lines to about a predefined precharge potential level, including,
        a substantially T-shaped first polysilicon gate portion having a first polysilicon area, a second polysilicon area, and a third polysilicon area, said T-shaped first polysilicon gate portion being oriented at a first angle relative to said first pair of bit lines, said first angle being an angle other than an integer multiple of 90°,
        a first switch coupled to a first bit line and a second bit line of said first pair of bit lines, said first polysilicon area representing a gate of said first switch, said first switch, when activated by a first signal supplied to said first polysilicon area, substantially equalizes potential levels on said first pair of bit lines,
        a second switch coupled to said first bit line of said first pair of bit lines and a precharge voltage supply source, said precharge voltage supply source supplying said predefined precharge potential level, said second polysilicon area representing a gate of said second switch, said second switch, when activated by said first signal supplied to said second polysilicon area, precharges said first bit line to about said predefined precharge potential level, and
        a third switch coupled to said second bit line of said first pair of bit lines and said precharge supply source, said third polysilicon area representing a gate of said third switch, said third switch, when activated by said first signal supplied to said third polysilicon area, precharges said second bit line to about said predefined precharge potential level.

12. The dynamic random access memory circuit of claim 11, further comprising
    a second pair of bit lines coupled to a second column of said memory cells, said second pair of bit lines extending into said first equalizer area, said second pair of bit lines being adjacent to said first pair of bit lines; and
    a second equalizer circuit disposed in said first equalizer area for precharging said second pair of bit lines to about said predefined precharge potential level, including,
        a substantially T-shaped second polysilicon gate portion oriented at a second angle relative to said second pair of bit lines, said second angle also being an angle other than an integer multiple of 90°, said substantially T-shaped second polysilicon gate portion being electrically coupled with said substantially T-shaped first polysilicon gate portion through a polysilicon layer employed to form said substantially T-shaped first polysilicon gate portion and said substantially T-shaped second polysilicon gate portion.

13. The dynamic random access memory circuit of claim 12 wherein said substantially T-shaped first polysilicon gate portion is about 45° clockwise relative to said first pair of bit lines, said substantially T-shaped second polysilicon gate portion is about 45° counterclockwise relative to said second pair of bit lines, said second pair of bit lines being parallel to said first pair of bit lines.

14. The dynamic random access memory circuit of claim 12 wherein said first polysilicon area is disposed in a vertical portion of said substantially T-shaped first polysilicon gate portion.

15. The dynamic random access memory circuit of claim 14 wherein said second polysilicon area is disposed in a horizontal portion of said substantially T-shaped first polysilicon gate portion.

16. The dynamic random access memory circuit of claim 15 wherein said third polysilicon area is disposed in another horizontal portion of said substantially T-shaped first polysilicon gate portion.

17. The dynamic random access memory circuit of claim 14 further comprising a first bit line contact disposed on a first side of said first polysilicon area, said first bit line contact coupling a first active area of said first switch to said first bit line of said first pair of bit lines.

18. The dynamic random access memory circuit of claim 17 further comprising a second bit line contact disposed on a second side of said first polysilicon area opposite said first side, said second bit line contact coupling a second active area of said first switch to said second bit line of said first pair of bit lines.

19. The dynamic random access memory circuit of claim 12 wherein said first equalizer circuit and said second equalizer circuit are coupled to said precharge voltage supply source through a fourth switch.

20. A pair of equalizer circuits for equalizing adjacent pairs of bit lines of a dynamic random access memory array, comprising:

a first equalizer circuit for precharging a first pair of bit lines of said adjacent pairs of bit lines, said first equalizer circuit including a substantially T-shaped first polysilicon gate portion oriented at a first angle relative to said first pair of bit lines, said first angle being an angle other than an integer multiple of 90°, said substantially T-shaped first polysilicon gate portion includes a first polysilicon area disposed in a vertical portion of said substantially T-shaped first polysilicon gate portion for implementing a gate of a first switch of said first equalizer circuit, said first switch being coupled to a first bit line and a second bit line of said first pair of bit lines;

a second polysilicon area disposed in a first horizontal portion of said substantially T-shaped first polysilicon gate portion for implementing a gate of a second switch of said first equalizer circuit, said second switch being coupled to said first bit line of said first pair of bit lines and a precharge voltage source; and a third polysilicon area, disposed in a second horizontal portion of said substantially T-shaped first polysilicon gate portion opposite said first horizontal portion, for implementing a gate of a third switch of said first equalizer circuit, said third switch being coupled to said second bit line of said first pair of bit lines and said precharge voltage source.

21. The pair of equalizer circuits of claim 20, further comprising:

a second equalizer circuit for precharging a second pair of bit lines of said adjacent pair of bit lines, said second equalizer circuit including a substantially T-shaped second polysilicon gate portion oriented at a second angle relative to said second pair of bit lines, said second angle also being an angle other than an integer multiple of 90°, said substantially T-shaped second polysilicon gate portion includes a fourth polysilicon area disposed in a vertical portion of said substantially T-shaped second polysilicon gate portion for implementing a gate of a first switch of said second equalizer circuit, said first switch being coupled to a first bit line and a second bit line of said second pair of bit lines;

a second polysilicon area disposed in a first horizontal portion of said substantially T-shaped second polysilicon gate portion for implementing a gate of a second switch of said second equalizer circuit, said second switch being coupled to said first bit line of said second pair of bit lines and a precharge voltage source; and a third polysilicon area, disposed in a second horizontal portion of said substantially T-shaped second polysilicon gate portion, for implementing a gate of a third switch of said second equalizer circuit, said third switch being coupled to said second bit line of said second pair of bit lines and said precharge voltage source, wherein said second horizontal portion of said substantially T-shaped second silicon gate portion is coupled with said second horizontal portion of said substantially T-shaped first silicon gate portion.

22. The pair of equalizer circuits of claim 21 wherein said substantially T-shaped first polysilicon gate portion is about 45° clockwise relative to said first pair of bit lines, said substantially T-shaped second polysilicon gate portion is about 45° counterclockwise relative to said second pair of bit lines, said second pair of bit lines being parallel to said first pair of bit lines.

\* \* \* \* \*